US005771144A

United States Patent [19]
Kim

[11] Patent Number: 5,771,144
[45] Date of Patent: Jun. 23, 1998

[54] CLEANING DEVICE FOR A CONTACT SURFACE OF A PRINTED CIRCUIT BOARD

[75] Inventor: Yu-In Kim, Incheon, Rep. of Korea

[73] Assignee: Daewoo Electronics Co., Ltd., Seoul, Rep. of Korea

[21] Appl. No.: 625,297

[22] Filed: Apr. 1, 1996

[30] Foreign Application Priority Data

Mar. 31, 1995 [KR] Rep. of Korea .................... 1995-7182

[51] Int. Cl.[6] .................................................. B08B 11/00
[52] U.S. Cl. ............................................................. 360/137
[58] Field of Search ........................... 360/137, 90, 128; 369/72, 73, 74; 15/256.5, DIG. 12, DIG. 13, DIG. 14

[56] References Cited

U.S. PATENT DOCUMENTS

| 3,618,958 | 11/1971 | Schmidlin | 369/74 |
|---|---|---|---|
| 4,198,056 | 4/1980 | Cooper | 369/74 X |
| 4,268,934 | 5/1981 | Testone | 15/306 B |
| 4,951,425 | 8/1990 | Naghi | 51/205 WG |
| 5,201,093 | 4/1993 | Wells et al. | 360/128 X |

*Primary Examiner*—Sturart S. Levy
*Assistant Examiner*—William R. Korzuch
*Attorney, Agent, or Firm*—Beveridge, Degrandi, Weilacher & Young LLP

[57] ABSTRACT

The invention provides a device for cleaning a contact surface on a PCB with a cleaning portion having a wiper. The cleaning device for the contact surface is fixed to the bottom face of a mode detection portion having sensing projections for sensing a signal by contacting the contact surface on the PCB. The device comprises a fixing part for fixing the cleaning portion to the loading means in one side, two elastic guards for protecting the elastic legs of the mode detection portion by being formed as an entity with the fixing part, and a wiper having a proper shape for connecting the above two elastic guards and for removing unwanted matters from the contact surface by contacting and sliding on the contact surface on the PCB against the bottom face. The wiper of the device for cleaning the contact surface removes unwanted matters from the contact surface while sliding the contact surface on the PCB, and thus prevents erroneous operation that can occur in case of detecting a signal with contacting the mode detection portion on the contact surface.

16 Claims, 6 Drawing Sheets

CLEANING DEVICE FOR A CONTACT SURFACE OF A PRINTED CIRCUIT BOARD

BACKGROUND OF THE INVENTION

1. Field of the Invention

This invention relates to a cleaning device for removing unwanted matters from a contact surface, and more particularly, to a cleaning device having a cleaning portion which is intended to clean a running surface while sliding on a contact surface on a PCB (printed circuit board).

2. Description of the Prior Art

Unwanted matters can adhere to the contact surface on the PCB, a magnetic head, a glass window of automobiles, etc. These unwanted matters prevent these devices from doing their operations or interfere with their functions. Therefore, various cleaning devices have been proposed for ensuring reliability of each device's operations and functions by removing unwanted matters from the contact surface.

One of the cleaning devices in prior art is a wiper made of a polymeric material with a wiping edge which is intended to clean the running surface during a reciprocating motion of a bearing element made in the form of a recirculating roller shoe and thus keeps away unwanted matters from the rolling bearing. For example, a shaped part can be designed as a profiled rail, and the shape of an elastomer wiper can be formed to the shape of the profiled rail and its running surface. There is a disadvantage of such a conventional cleaning device in that it can destroy the sealing wiper lips because small abrasive and/or hot particles which are produced during the shaping operation in the profiled rail are accumulated at the wiper lips.

U.S. Pat. No. 1,938,786 discloses a wiper unit of the type initially described in which a wiper blade has an angular cross-section and which is retained in a receiving space formed between a bearing element and a supporting plate screwed onto the bearing element with interposition of spacer rings. This wiper blade is not fixed but retained movably within narrow limits and pressed against the running surface by a group of coiled springs. However the construction is very complicated because a group of coiled springs were used for providing elasticity to the wiper.

U.S. Pat. No. 5,237,477 discloses a head cleaner positioned in a path in which magnetic read/write heads are slidable 'so that the heads are cleaned when they contact the cleaner. Thus this removes unwanted particulate matters from the heads. This cleaner has to be inserted between two heads, while contacting both heads surfaces but without damaging those surfaces of the two heads. Thus thickness, size, and position of installation of the cleaner in a system have to be decided carefully.

The cleaning devices for removing unwanted matters described above are not proper to remove unwanted matters from the contact surface on the PCB used for a full logic deck mechanism of a conventional ACR (audio cassette tape recorder) and VCR (video cassette tape recorder). Various kinds of modes, e.g., ejecting, loading, unloading, stopping, and playing modes, are performed in the full logic deck mechanism of the ACR and VCR. The PCB has a contact surface designed to transmit various signals applied thereto. A mode detection portion is used to detect a mode signal by contacting the surface corresponding to each mode. But, because of unwanted matters adhered to the contact surface when the mode detection portion detects the mode signal, the mode detection portion may perform an erroneous operation. The above case will now be described in connection with the PCB of FIG. 1 and the mode detection portion shown in FIG. 2 through FIG. 4.

Figure 1:
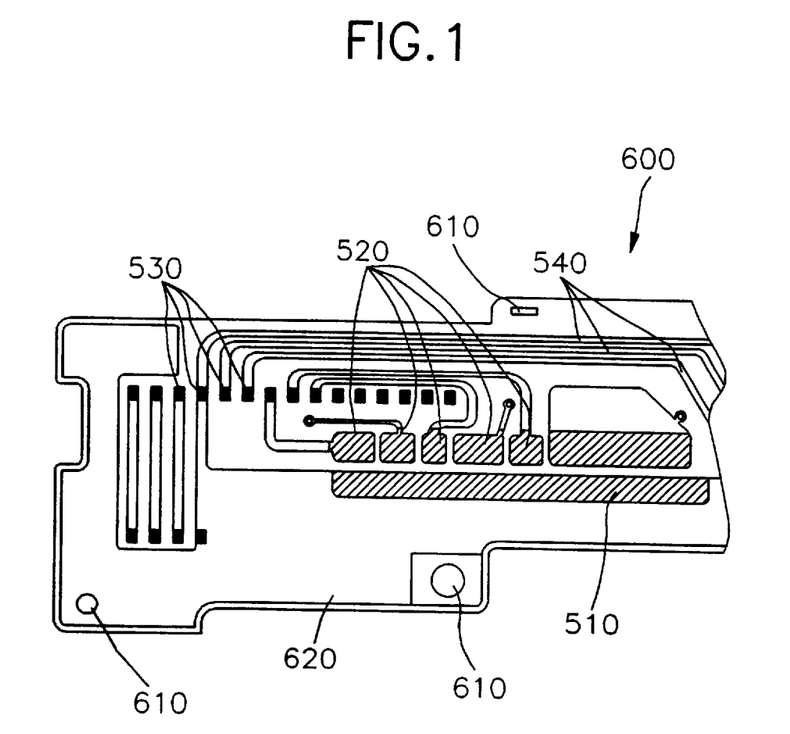
FIG. 1 is a front view of the PCB which has the wiring and component identification marking stamped on the board.

FIG. 1 is a front view of the PCB which has the wiring and component identification markings stamped on the board for transmitting predetermined signals applied thereto. PCB 600 includes holes 610 for fixing the PCB to a system. PCB 600 includes an insulating layer 620 covered with insulator materials and a signal transmitting part for transmitting an electric signal. The signal transmitting part includes a ground part 510 provided with a ground signal, a signal transmitting part 520 provided with each operation mode signal, a conducting wire part 540 for transmitting a signal to signal transmitting part 520, and a number of connection points 530 for connecting signal transmitting part 520 and conducting wire part 540. Insulating layer 620 is positioned between signal transmitting part 520 and conducting wire part 540. Thus signal transmitting part 520 and conducting wire part 540 are only connected by connection points 530.

Figure 2:
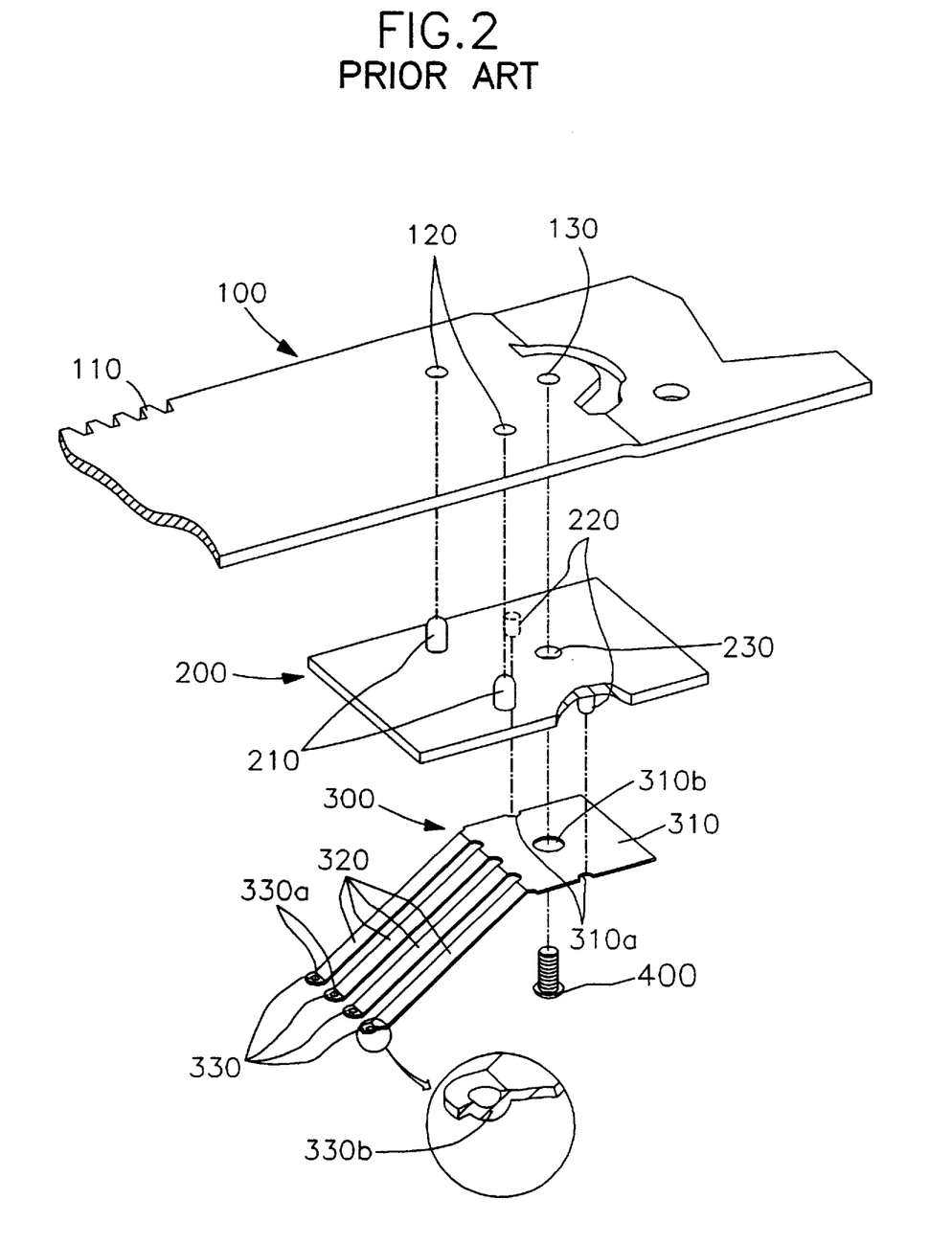
FIG. 2 is a perspective view of the mode detection portion of the conventional mode detection device.
Figure 3:
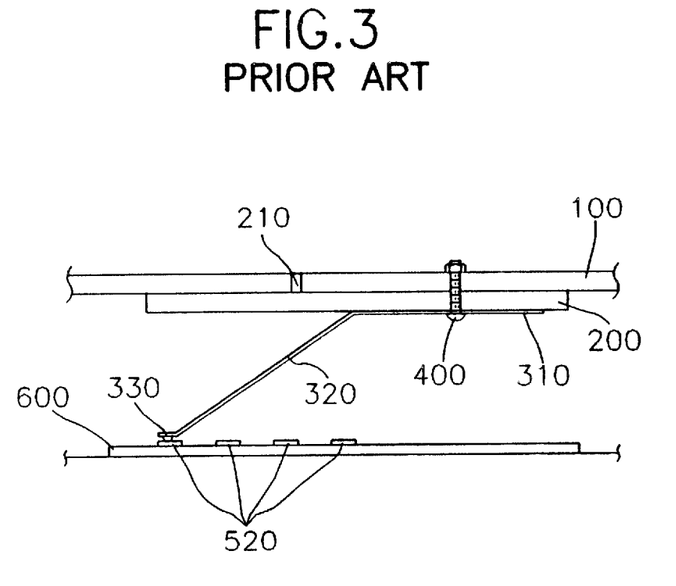
FIG. 3 is a side view of the mode detection portion of the conventional mode detection device.
Figure 4:
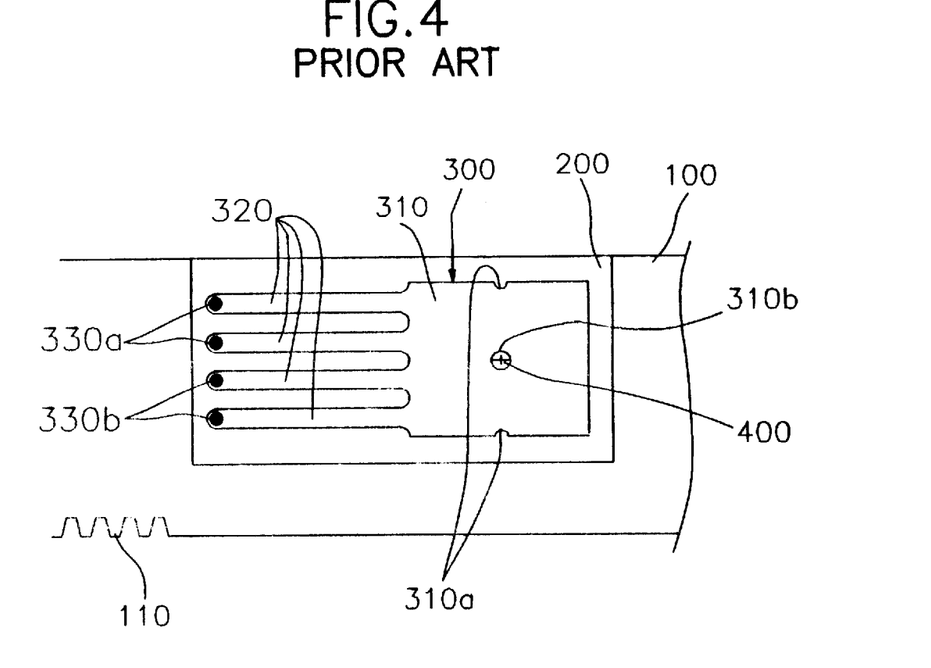
FIG. 4 is a bottom view of the mode detection portion of FIG. 3 without the PCB.

FIG. 2 is a perspective view of a mode detection portion and related components in the full logic deck mechanism of the ACR and VCR, FIG. 3 is a side view of assembled components as shown in FIG. 2, and FIG. 4 is a bottom view of the construction of mode detection device excluding the PCB in FIG. 3. Hereinafter a conventional mode detection device is described with reference to FIGS. 2 through 4.

A driving motor is connected to one part of a gear converting portion (not shown). The motor is driven by a signal from a mode selection button. The other part of gear converting portion is connected to a load lever gear 100. The load lever gear 100 has a rack part 110 with a predetermined length to be engaged with a gear converting portion. The rack part 110 is formed at a part of one of the edges for conveying operation of the driving motor. The bottom face of load lever gear 100 contacts to a holder 200 having a quadrangle shape. Load lever gear 100 includes first holes 120 for fixing holder 200 and a second hole 130 for fixing holder 200 and mode detection portion 300 thereto.

Holder 200 is made of insulating material for insulating between load lever gear 100 and mode detection portion 300. Holder 200 includes holder fixing projections 210 which are pierced through first holes 120 of load lever gear 100 in top surface. Holder 200 includes mode detection portion fixing projections 220 protruded in bottom face thereof for fixing mode detection portion 300 and a holder fixing hole 230 for fixing holder 200 to load lever gear 100. Holder fixing projections 210 of holder 200 pierce through first holes 120 of load lever gear 100 in order to fix holder 200 to load lever gear 100.

Mode detection portion 300 includes elastic legs 320 and fixing part 310 having a quadrangle shape, in which the elastic legs 320 are integrally formed with one edge of fixing part 310. Both sides of fixing part 310 include connection grooves 310*a*, 310*b* combined with mode detection portion fixing projections 220 of holder 200. Also fixing part 310 includes a mode detection portion fixing hole 310*b* for fixing mode detection portion 300 to load lever gear 100.

The bottom faces of elastic legs 320 are bent against the bottom face of fixing part 310 of mode detection portion 300. This bending provides elasticity to elastic legs 320. Ends of elastic legs 320 are folded in parallel with the bottom face of fixing part 310 of mode detection portion 300. Folded end part 330 has protruded sensing projections 330*a*, 330*b* in which protrude in a vertical direction toward the bottom face of the folded end part 330. Sensing projections 330*a*, 330*b* include mode sensing projections 330*a* for sensing a signal applied to signal transmitting part 520 and ground sensing projections 330b being in contact with ground part 510 on PCB 600. Mode detection portion 300 is fixed to holder 200 by inserting mode detection portion fixing projections 220 of holder 200 into connection grooves 310 of mode detection portion 300. Holder 200 and mode detection portion 300 are fixed to load lever gear 100 by screwing a bolt 400 into mode detection portion fixing hole 310b of mode detection portion 300, holder fixing hole 230 of holder 200, and second hole 130 of load lever gear 100. The bolt 400 is made of an insulating material or used with an insulating washer.

The operation of the mode detection device having above construction is described with reference to the contact surface on the PCB in FIG. 1. If user presses the mode selection button, a signal corresponding to selected mode is applied to one of the signal transmitting parts 520 on PCB 600, and the driving motor initiates its operation. The gear converting portion (e.g., a number of toothed wheels) operates according to the operation of the driving motor. After gear converting portion is engaged with rack 110 of load lever gear 100, load lever gear 100 moves in the horizontal direction against PCB 600. According to the horizontal movement of load lever gear 100, sensing projections 330a, 330b of mode detection portion 300 fixed to load lever gear 100 slide on the contact surface on PCB 600. Sensing projections 330a, 330b of mode detection portion 300 detect the mode signal by sliding on the contact surface of ground part 510 and signal transmitting part 520 on the PCB.

However, such device has a problem of contaminating the contact surface of the PCB with unwanted matters generated within the device itself when used for a long time, as well as with unwanted matters introduced from outside during its use. Particularly, if contaminant is a conductible matter, erroneous operation may be caused by the matter when mode detection portion detects the signal on the contact surface on the PCB. This erroneous operation reduces reliability and security of all systems.

SUMMARY OF THE INVENTION

Thus, the present invention is proposed to solve this problem. It is an object of the present invention to provide a cleaning device for cleaning the contact surface on the PCB by removing unwanted matter from the contact surface on the PCB and thus preventing erroneous operation caused by the unwanted matters.

The cleaning device of the present invention comprises a load lever gear moving in a horizontal direction according to the driving of a driving motor; a holder made of an insulating material and with a quadrangle shape by making contact with the bottom face of the load lever gear; a mode detection portion for sensing signals from the contact surface on the PCB; and a cleaning portion attached to the bottom face of the mode detection portion for removing unwanted matters from the contact surface on the PCB.

The load lever gear has a rack with predetermined length to be engaged with a gear converting portion, first holes and a second hole being located at a predetermined length from the first holes. The rack is formed at a part of one of the edges of the load lever gear for conveying operation of the driving motor.

The holder includes holder fixing projections pierced through first holes of the load lever gear, the holder fixing hole fitted to the second hole of the load lever gear, and the mode detection portion fixing projections protruded at the bottom face thereof.

The mode detection portion includes a fixing part, elastic legs, a folded end part, and sensing projections. The fixing part includes fixing grooves formed at both sides of the fixing part for being connected with the mode detection portion fixing projections and the mode detection portion fixing hole for fixing the mode detection portion to the holder and the load lever gear; the elastic legs are connected with one of the edges of the fixing part and folded in parallel with the bottom face of the fixing part; the folded end part is folded in parallel with the bottom face of the fixing part at one end of the elastic legs; and the sensing projections are attached to the contact surface on the PCB by being projected in the bottom direction against the center of the bottom face of the folded end part.

The cleaning portion has a cleaning portion fixing part, elastic guards, and a wiper. The cleaning portion fixing part has a rugged edge for covering the mode detection portion fixing part and holes for fixing the cleaning portion to the holder and a hole for connecting the mode detection portion to the load lever gear; the elastic guards are connected to both sides of the rugged edge, folded in parallel with the bottom face of the cleaning portion fixing part, and thinner in thickness than the cleaning portion fixing part so that they have elasticity and protect the elastic legs of the mode detection portion; and the wiper is connected to the ends of the elastic guards for removing unwanted matters from the contact surface on the PCB by using the bottom face of the wiper in parallel with the bottom face of the cleaning portion fixing part.

In accordance with the present invention, the mode detection portion and the cleaning portion slide on the contact surface of the PCB according to the movement in a horizontal direction of the load lever gear. While the cleaning portion slides on the contact surfaces of the signal transmitting part and the ground part, unwanted matters adhered to those surfaces are removed. Thus mode sensing projections formed at the end of the mode detection portion can detect the signal correctly by sliding on a cleaned surface of the signal transmitting part and the ground part. Therefore by using the cleaning device of the present invention, erroneous operation of all systems caused by unwanted matters can be prevented.

BRIEF DESCRIPTION OF THE DRAWINGS

Other features and advantages of the present invention will be more fully understood from the following detailed description of the preferred embodiment, the appended claims, and the accompanying drawings, in which:

DETAILED DESCRIPTION OF THE PREFERRED EMBODIMENTS

The present invention will now be described in more detail with reference to the accompanying FIGS. 5–7.

Figure 5:
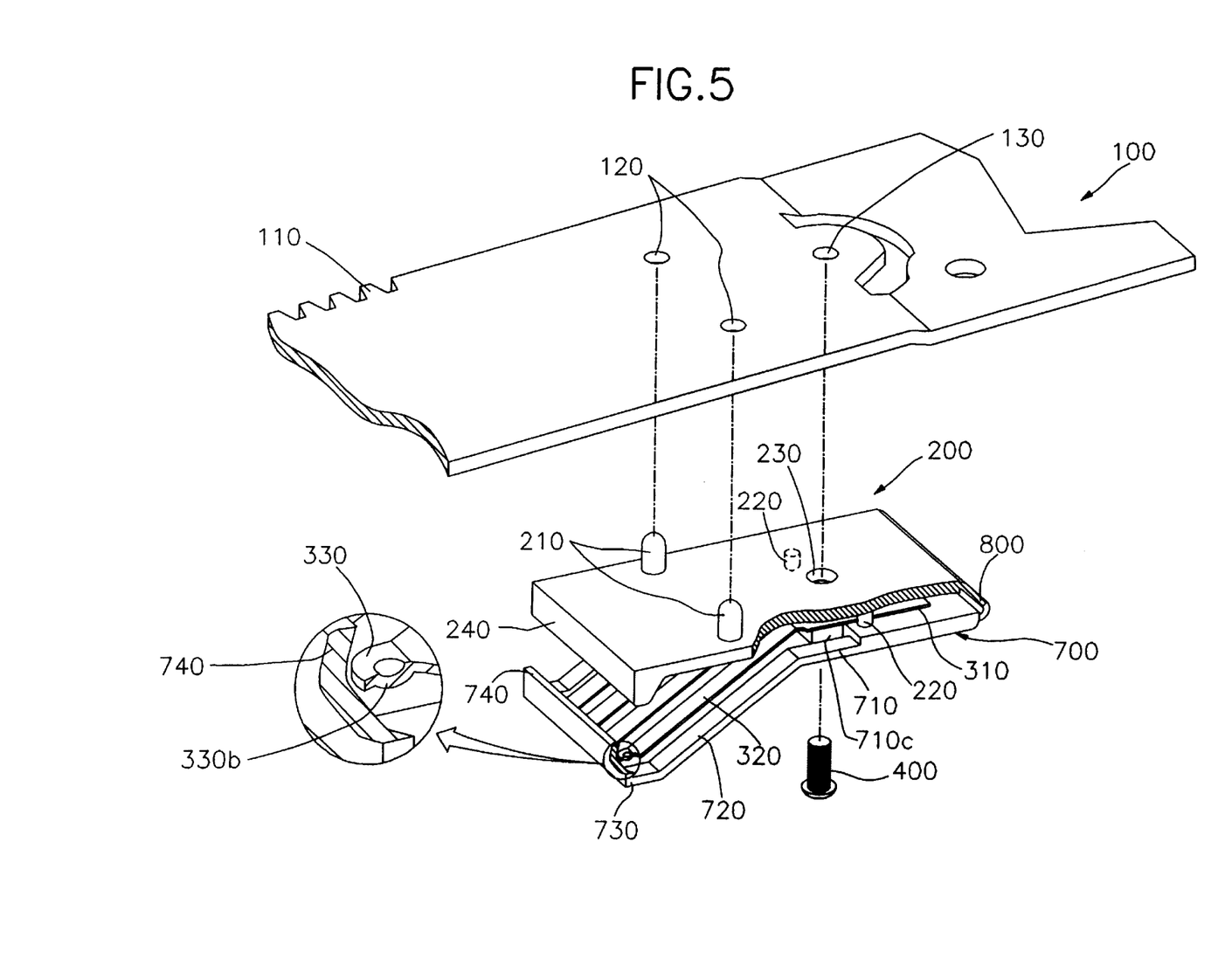
FIG. 5 is a perspective view of the mode detection portion of the mode detection device having a cleaning portion in accordance with the present invention.
Figure 6:
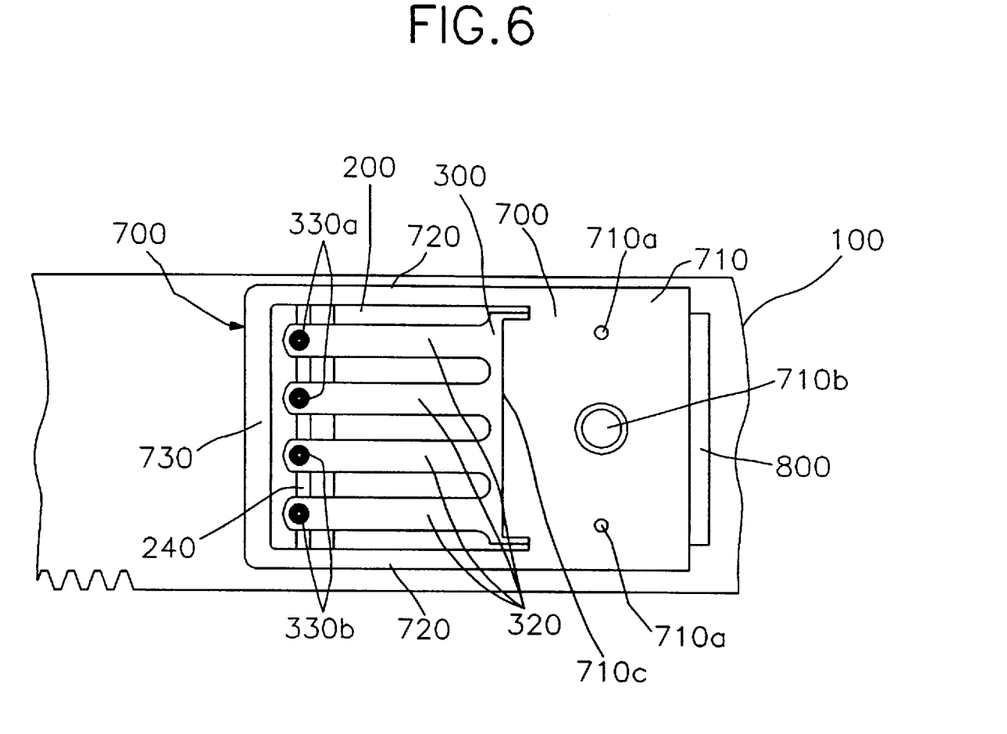
FIG. 6 is a bottom view of the mode detection portion of the mode detection device having a cleaning portion in accordance with the present invention.
Figure 7:
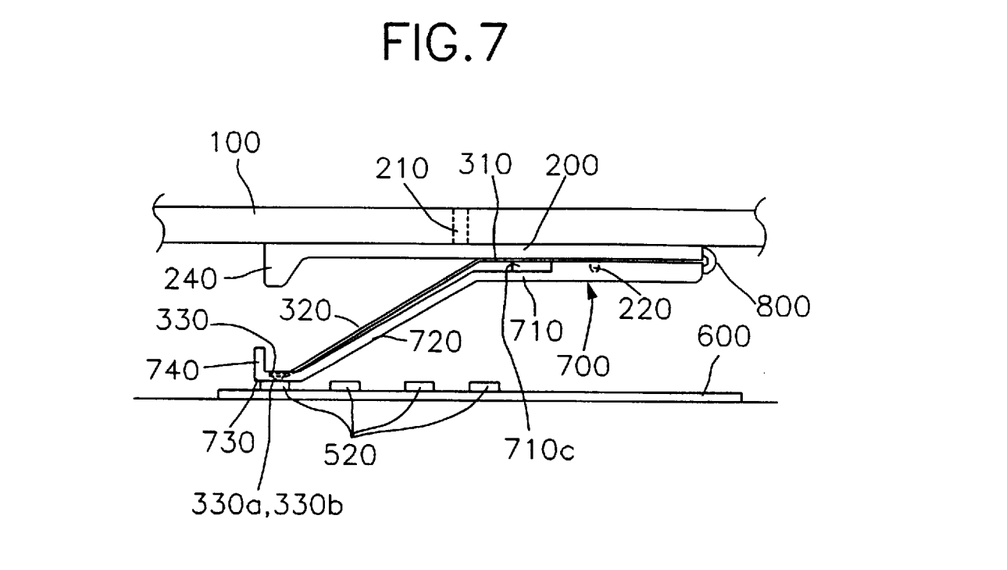
FIG. 7 is a side view of the mode detection portion of the mode detection device assembled with the cleaning portion in the present invention.

FIG. 5 is a perspective view of the mode detection portion of the mode detection device having a cleaning portion according to the present invention, FIG. 6 is a bottom view of the mode detection portion of FIG. 5, and FIG. 7 is a side view of the mode detection portion of the mode detection device assembled with the cleaning portion in the present invention. In the preferred embodiment of the present invention, the bottom face of load lever gear 100 contacts with holder 200 having a quadrangle shape and made of an insulating material for insulating load lever gear 100 from mode detection portion 300. Load lever gear 100 includes first holes 120 for fixing holder 200 and second hole 130 for fixing holder 200 and mode detection portion 300 in one part.

Holder 200 includes holder fixing projections 210 protruded on top face of holder 200 for fixing holder 200 to load lever gear 100 by piercing through first holes 120 of load lever gear 100. Holder 200 includes mode detection portion fixing projections 220 protruded at the bottom face of holder 200 for fixing mode detection portion 300 and a holder fixing hole 230 for fixing holder 200 to load lever gear 100. Holder 200 includes sensing projections protecting part 240 in one edge for protecting sensing projections 330a, 330b of end part of elastic legs 320 of mode detection portion 300. Sensing projections protecting part 240 is protruded at the bottom face of holder 200 in the bottom direction with predetermined height. Holder 200 includes hinge connection part 800 in the other edge. Holder 200 is fixed to load lever gear 100 by inserting holder fixing projections 210 to first holes 120 of load lever gear 100.

Mode detection portion 300 includes elastic legs 320 and fixing part 310 having a quadrangle shape. Fixing part 310 has elastic legs 320 in one of its edges. Fixing part 310 includes connection grooves 310a in both sides for fixing mode detection portion 300 by inserting mode detection portion fixing projection 220 of holder 200 thereto. Also, fixing part 310 includes a mode detection portion fixing hole 310b for fixing mode detection portion 300 to load lever gear 100.

Bottom faces of elastic legs 320 are bent against the bottom face of fixing part 310 of mode detection portion 300, The bending provides elasticity to elastic legs 320. End parts of elastic legs 320 are folded end parts 330 bent in such a way that their bottom faces are in parallel with the bottom face of fixing part 310 of mode detection portion 300. Folded end parts 330 of elastic legs 320 include sensing projections 330a, 330b perpendicularly protruded at the bottom face of folded end parts 330. Mode detection portion 300 is fixed to holder 200 by inserting mode detection portion fixing projections 220 of holder 200 into connection grooves 310a of mode detection portion 300. The bottom face of mode detection portion 300 is in contact with cleaning portion 700 of the present invention.

Cleaning portion 700 includes cleaning portion fixing part 710 having a quadrangle shape, elastic guards 720 for protecting elastic legs 320 of mode detection portion 300, wiper 730 for removing unwanted matters from the contact surface of ground part 510 and signal transmitting parts 520 on the PCB by contacting thereon, and wiper head 740. Cleaning portion fixing part 710 includes a mode detection portion connecting hole 710a for combining mode detection portion fixing projections 220 protruded at the bottom face of holder 200 and cleaning portion fixing hole 710b for fixing cleaning portion 700 to load lever gear 100. Cleaning portion fixing hole 710b is composed of inner hole with a diameter equal to that of second hole 130 of load lever gear 100 and outer hole having enlarged diameter and stepped along with circumference of inner hole. One of the edges of cleaning portion fixing part 710 has a rugged shape. The size of rugged edge 710c is appropriate for covering mode detection portion fixing part 310.

The thickness of elastic guards 720 is thinner than cleaning portion fixing part 710. Elastic guards 720 are bent against the bottom face of cleaning portion fixing part 710 like elastic legs 320 of mode detection portion 300. The reason for that is the elastic legs must have elasticity. Two elastic guards 720 are connected to each other as an entity through wiper part 730 formed at their end parts.

The bottom face of wiper part 730 is in parallel with the bottom face of cleaning portion fixing part 710. When holder 200, mode detection portion 300, and cleaning portion 700 are assembled together, wiper part 730 is located at outer side compared with folded end parts 330 of elastic legs 320 of mode detection portion 300. Wiper part 730 includes wiper head 740 protruded perpendicularly at top face thereof. Wiper head 740 is located at a position outside sensing projections protecting part 240 of holder 200, based upon a directional starting point in which hinge 800 is the inner most point and wiper head is the outer most point. One part of the above cleaning portion 700 includes hinge connection part 800 integrally formed with the hinge connecting part 800 of holder 200.

Figure 8:
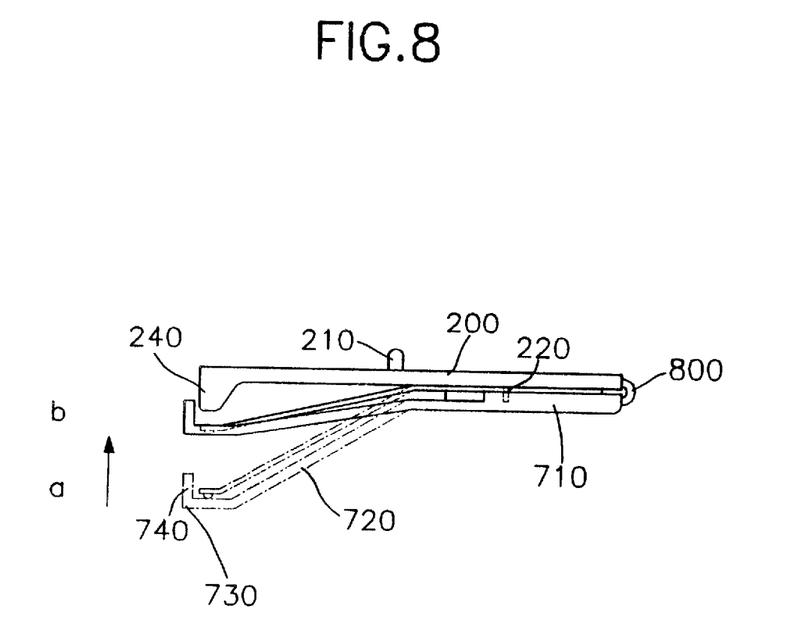
FIG. 8 is a side view of the cleaning portion of the mode detection device assembled with the mode detection portion when the wiper is pressed.

FIG. 8 shows the arrangement of sensing projections protecting part 240 of holder 200, elastic guards 720 of cleaning portion 700, and wiper head 740 of cleaning portion 700 when pressed horizontally upward against the bottom face of wiper part 730 in a state of assembling conventional mode detection portion 300 with cleaning portion 700 in the present invention. When wiper 730 is pressed with perpendicular force, elastic guards 720 change their positions from a to b by the force provided therefor. Because the position of wiper 730 is changed, one face of sensing projections protecting part 240 approaches one of the faces of wiper head 740.

Now we will describe operations and effects in the above constitution in accordance with accompanying FIGS. 5 through 8.

When the user selects an operation, the signal corresponding to the selection is provided to signal transmitting part 520 on the PCB and is transmitted to the driving motor. The driving motor is then circulated. While the driving motor is circulated, the gear converting portion connected to load lever gear 100 is linked together. Load lever gear 100 moves in the horizontal direction by engaging rack 110 of load lever gear 100 with linked gear. Because holder 200 and mode detection portion 300 having sensing projections 330a, 330b in folded end part 330 of elastic legs 320 are fixed to load lever gear 100, as load lever gear 100 moves in the horizontal direction, the bottom face of wiper 730 of cleaning portion 700 hinged with holder 20Q contacts with signal transmitting parts 520 and ground part 510 on PCB 600. Wiper 730 being in contact with signal transmitting parts 520 and ground part 510 slides on their surfaces while removing unwanted matters from the surfaces. Also, as load lever gear 100 moves in the horizontal direction, sensing projections 330a, 330b formed at folded end part 330 of elastic legs 320 of mode detection portion 300 which is fixed to load lever gear 100 slide on surfaces of signal transmitting parts 520 and ground part 510 on the PCB while contacting thereon. Mode detection portion 300 is conducted when sensing projections 330a, 330b contact to ground part 510 and signal transmitting parts 520 on PCB 600 receiving the selected signal.

As described above, whenever user selects a function, load lever gear 100 moves in the horizontal direction. Whenever load lever gear 100 moves in the horizontal direction, wiper 730 of cleaning portion 700 hinged with holder 200 slides on the surface of ground part 510 and signal transmitting part 520 on PCB 600. Because wiper 730 slides on the surface of ground part 510 and signal transmitting part 520 on the PCB, unwanted matters adhered to the contact surface are removed. Thus the contact surfaces 510, 520 on the PCB can remain clean at all times. Sensing projection 330a, 330b then come in contact with these clean surfaces 510, 520. Therefore it is possible to prevent erroneous operation caused by unwanted matters when mode detection portion 300 is conducted by contacting sensing projections 330a, 330b. As a result, if cleaning portion 700 having wiper 730 in the present invention is used, reliability of the entire system can be achieved.

The formed and folded shape of elastic legs 320 in one part of mode detection portion 300 can be easily deformed by weak power. Particularly, before mode detection portion 300 is assembled with load lever gear 100, folded angle of elastic legs 320 can be changed or elastic legs 320 can be broken when mode detection portion 300 is pressed by external force. If the shape of elastic legs 320 is changed, mode detection portion 300 cannot perform its function even though mode detection portion 300 is assembled with load lever gear 100.

However, in the present invention, elastic legs 320 can be prevented from being broken by external force. The reason is that wiper head 740 and sensing projections protecting part 240 have a predetermined height and protect elastic legs 320 when assembled in the system. Therefore, the shape of the mode detection portion 300 is not changed even though external force is applied. Thus erroneous operation that can occur after mode detection portion 300 is assembled with load lever gear 100 can be prevented.

The present invention is in no way limited to the embodiment described hereinabove. Various modifications of disclosed embodiment as well as other embodiments of the invention will become apparent to persons skilled in the art upon reference to the description of the invention. For example, cleaning portion is not hinge connected to holder and can have an independent shape.

What is claimed is:

1. A cleaning device for a contact surface on a printed circuit board, comprising:
    a loading means for loading said cleaning device, said loading means moving in a horizontal direction according to the driving of a driving motor;
    a holding means for retaining a mode detection means, said holding means made of an insulating material and being in contact with the bottom face of said loading means;
    said mode detection means sensing a signal provided in the contact surface on the printed circuit board, said mode detection means having a first fixing part being in contact with the bottom face of said holding means and a number of elastic legs connecting with one of the edges of said first fixing part and having a predetermined angle bent against the bottom face of said first fixing part; and
    a cleaning means for removing matters attached to the contact surface on the printed circuit board, said cleaning means having a second fixing part being in contact with the bottom face of said first fixing part of said mode detection means, a wiper being in contact with the contact surface on the printed circuit board, and two elastic guards coupled between both ends of one of the edges of said second fixing part and both ends of said wiper, said wiper having a wiper head which protrudes from the top face of said wiper with a predetermined height in order to protect end parts of said number of elastic legs, and wherein said holding means has a protecting part protruding from the bottom of said holding means for protecting said end parts of said number of elastic legs.

2. The cleaning device for a contact surface on a printed circuit board according to claim 1, wherein said loading means is a load lever gear.

3. The cleaning device for a contact surface on a printed circuit board according to claim 1, wherein said loading means includes:
    a rack formed at a part of one of the edges of said loading means and engaged with a gear converting portion for conveying operation of the driving motor;
    a number of first holes for fixing said holding means to said loading means; and
    a second hole being located at a predetermined length from said number of first holes for fixing said mode detection means to said loading means.

4. The cleaning device for a contact surface on a printed circuit board according to claim 1, wherein said holding means comprises:
    a first fixing hole for fixing said holding means to said loading means;
    a number of first fixing projections protruding from the top face of said holding means for fixing said holding means to said loading means; and
    a number of second fixing projections protruding from the bottom face of said holding means for fixing said mode detection means to said holding means.

5. The cleaning device for a contact surface on a printed circuit board according to claim 4, wherein said first fixing part comprises:
    a number of connection grooves in both sides of said mode detection means for fixing said mode detection means to said holding means; and
    a second fixing hole in the top face of said mode detection means for fixing said mode detection means to said loading means.

6. The cleaning device for a contact surface on a printed circuit board according to claim 4, wherein said second fixing part comprises:
    a number of second fixing holes for fixing said cleaning means to said holding means; and
    a third fixing hole for fixing said cleaning means to said loading means.

7. The cleaning device for a contact surface on a printed circuit board according to claim 4, wherein said second fixing part comprises a rugged edge in one of the edges of said second fixing part for covering said first fixing part and for providing elasticity to said two elastic guards.

8. The cleaning device for a contact surface on a printed circuit board according to claim 1, wherein said number of elastic legs comprise:
    a number of folded end parts in one end of said number of elastic legs and bottom faces of said number of folded end parts bent in parallel with the bottom face of said first fixing part; and a number of sensing projections protruding perpendicularly in a bottom direction in the center of said folded end parts for sensing a signal provided in said contact surface on said printed circuit board.

9. The cleaning device for a contact surface on a printed circuit board according to claim 8, wherein said number of sensing projections comprise:

a number of ground sensing projections for sensing a ground signal provided at a number of ground parts on said printed circuit board; and a number of mode sensing projections for sensing a mode selection signal provided at a number of signal transmitting parts on said printed circuit board.

10. The cleaning device for a contact surface on a printed circuit board according to claim 1, wherein the thickness of said two elastic guards is less than the thickness of said second fixing part.

11. The cleaning device for a contact surface on a printed circuit board according to claim 1, wherein said two elastic guards have elasticity caused by being bent in a predetermined angle from the bottom face of said second fixing part for protecting said number of elastic legs of said mode detection means.

12. The cleaning device for a contact surface on a printed circuit board according to claim 1, wherein said wiper is connected to the ends of said elastic guards for removing matters attached to said contact surface on said printed circuit board by using a bottom face of said wiper in parallel with the bottom face of said second fixing part.

13. The cleaning device for a contact surface on a printed circuit board according to claim 1, wherein said cleaning means is made of a polymeric material.

14. The cleaning device for a contact surface on a printed circuit board according to claim 1, wherein one of the edges of said holding means is hinged with one of the edges of said cleaning means.

15. A cleaning device for a contact surface on a printed circuit board, comprising:

a loading means for loading said cleaning device, said loading means moving in a horizontal direction according to the driving of a driving motor and including a rack formed at a part of one of the edges of said loading means and engaged with a gear converting means for conveying operation of said driving motor, a number of first holes for fixing a holding means to said loading means, and a second hole being located at a predetermined length from said number of first holes for fixing a mode detection means to said loading means;

a holding means for retaining the mode detection means, said holding means made of an insulating material, being in contact with the bottom face of said loading means, and including a number of first fixing projections which protrude from the top face of said holding means and pierce through said number of first holes of said loading means, a first fixing hole fitted to said second hole of said loading means, a number of second fixing projections protruding from the bottom face of said holding means, and a protecting part protruding from the bottom face of said holding means for protecting end parts of a number of elastic legs of said mode detection means;

said mode detection means for sensing a signal provided in said contact surface on the printed circuit board, said mode detection means including a first fixing part, said number of elastic legs, a number of folded end parts, and a number of sensing projections:

said first fixing part including a number of connection grooves in both sides of said mode detection means for fixing said mode detection means to said holding means and a second fixing hole for fixing said mode detection means to said loading means, said number of elastic legs include said number of folded end parts in one end of said number of elastic legs and whose bottom faces are bent in parallel with the bottom face of said first fixing part and said number of sensing projections protrude perpendicularly in a bottom direction in the center of said folded end parts for sensing a signal provided in said contact surface on said printed circuit board, and said number of sensing projections including a number of ground sensing projections for sensing a ground signal provided at a number of ground parts on said printed circuit board and a number of mode sensing projections for sensing a mode selection signal provided at a number of signal transmitting parts on said printed circuit board;

cleaning means made of a polymeric material and attached to the bottom face of said mode detection means for removing matters attached to the contact surface on said printed circuit board, said cleaning means having a second fixing part being in contact with the bottom face of said first fixing part of said mode detection means, two elastic guards, a wiper, and a wiper head:

said second fixing part having a rugged edge in one of the edges of said second fixing part for providing elasticity to said two elastic guards and for covering said first fixinq part, a number of second fixing holes for fixing said cleaning means to said holding means, and a third fixing hole for fixing said cleaning means to said loading means, said two elastic guards being coupled between both ends of one of the edges of said second fixing part and both ends of said wiper and have elasticity caused by being bent in a predetermined angle from the bottom face of said second fixing part for protecting said number of elastic legs of said mode detection means, said wiper being connected to the ends of said elastic guards for removing matters attached to said contact surface on said printed circuit board by using a bottom face of said wiper in parallel with the bottom face of said second fixing part, and said wiper head protruding from the top face of said wiper with a predetermined height in order to protect said end parts of said number of elastic legs; and one part of said holding means being hinged together with one of the edges of said cleaning means.

16. A cleaning device for a contact surface on a printed circuit board, comprising:

a loading means for loading said cleaning device, said loading means moving in a horizontal direction according to the driving of a driving motor;

a holding means for retaining a mode detection means, said holding means made of an insulating material and being in contact with the bottom face of said loading means;

said mode detection means for sensing a signal provided in the contact surface on the printed circuit board, said mode detection means having a first fixing part being in contact with the bottom face of said holding means and a number of elastic legs connecting with one of the edges of said first fixing part and having a predetermined angle bent against the bottom face of said first fixing part, said number of elastic legs comprising:

a number of folded end parts in one end of said number of elastic legs and bottom faces of said number of folded end parts bent in parallel with the bottom face of said first fixing part; and a number of sensing projections protruding perpendicularly in a bottom direction in the center of said folded end parts for sensing a signal provided in said contact surface on said printed circuit board; and a cleaning means for removing matters attached to the contact surface on the printed circuit board, said cleaning means having a second fixing part being in contact with the bottom face of said first fixing part of said mode detection means, a wiper being in contact with the contact surface on the printed circuit board, and two elastic guards coupled between both ends of one of the edges of said second fixing part and both ends of said wiper, said wiper having a wiper head which protrudes from the top face of said wiper with a predetermined height in order to protect said folded end parts of said number of elastic legs;

said second fixing part comprising:

a number of first fixing holes for fixing said cleaning means to said holding means;

a second fixing hole for fixing said cleaning means to said loading means; and a rugged edge in one of the edges of said second fixing part for covering said first fixing part and for providing elasticity to said two elastic guards;

said two elastic guards having elasticity caused by being bent in a predetermined angle from the bottom face of said second fixing part for protecting said number of elastic legs of said mode detection means; and said wiper being connected to the ends of said elastic guards for removing matters attached to said contact surface on said printed circuit board by using a bottom face of said wiper in parallel with the bottom face of said second fixing part.

* * * * *